United States Patent
Martinez et al.

(10) Patent No.: US 6,893,947 B2
(45) Date of Patent: May 17, 2005

(54) ADVANCED RF ENHANCEMENT-MODE FETS WITH IMPROVED GATE PROPERTIES

(75) Inventors: Marino J. Martinez, Nashua, NH (US); Ernest Schirmann, Lake Zurich, IL (US); Olin L. Hartin, Phoenix, AZ (US); Colby G. Rampley, Phoenix, AZ (US); Mariam G. Sadaka, Phoenix, AZ (US); Charles E. Weitzel, Mesa, AZ (US); Julio Costa, Phoenix, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 149 days.

(21) Appl. No.: 10/179,769

(22) Filed: Jun. 25, 2002

(65) Prior Publication Data

US 2003/0235974 A1 Dec. 25, 2003

(51) Int. Cl.[7] .............................................. H01L 21/22
(52) U.S. Cl. ...................................... 438/555; 438/559
(58) Field of Search ................................ 438/555, 570, 438/47, 514

(56) References Cited

U.S. PATENT DOCUMENTS

| | | | | |
|---|---|---|---|---|
| 4,532,695 A | * | 8/1985 | Schuermeyer | 438/285 |
| 5,041,393 A | * | 8/1991 | Ahrens et al. | 438/172 |
| 5,196,358 A | * | 3/1993 | Boos | 438/186 |
| 5,266,506 A | * | 11/1993 | Green, Jr. | 438/172 |
| 5,484,740 A | | 1/1996 | Cho | 437/40 |
| 5,514,606 A | | 5/1996 | Hashemi et al. | 437/41 |
| 5,619,064 A | | 4/1997 | Cho | 257/637 |
| 5,804,849 A | | 9/1998 | Wennekers | 257/280 |
| 5,900,641 A | | 5/1999 | Hara et al. | 257/20 |
| 5,940,695 A | * | 8/1999 | Berenz | 438/172 |
| 5,949,095 A | * | 9/1999 | Nagahara et al. | 257/192 |
| 6,057,219 A | | 5/2000 | Cho et al. | 438/597 |
| 6,153,519 A | | 11/2000 | Jain et al. | 438/681 |
| 6,156,611 A | | 12/2000 | Lan et al. | 438/268 |
| 6,262,461 B1 | | 7/2001 | Marshall et al. | 257/410 |
| 6,278,141 B1 | | 8/2001 | Mitani et al. | 257/194 |
| 2003/0075719 A1 | * | 4/2003 | Sriram | 257/77 |

* cited by examiner

*Primary Examiner*—David Nelms
*Assistant Examiner*—Thao P. Le
(74) *Attorney, Agent, or Firm*—John A. Fortkort; Fortkort Grether & Kelton LLP (57) ABSTRACT

A method for fabricating an RF enhancement mode FET (30) having improved gate properties is provided. The method comprises the steps of providing (131) a substrate (31) having a stack of semiconductor layers (32–35) formed thereon, the stack including a cap layer (35) and a central layer (33) defining a device channel, forming (103) a photoresist pattern (58) over the cap layer, thereby defining a masked region and an unmasked region, and, in any order, (a) creating (105) an implant region (36, 37) in the unmasked region, and (b) removing (107) the cap layer from the unmasked region. By forming the implant region and cap region with no overlap, a device with low current leakage may be achieved.

23 Claims, 5 Drawing Sheets

ADVANCED RF ENHANCEMENT-MODE FETS WITH IMPROVED GATE PROPERTIES

FIELD OF THE INVENTION

The present invention relates generally to methods for fabricating enhancement mode RF devices, and more particularly to methods for making enhancement mode FETs with improved gate properties.

BACKGROUND OF THE INVENTION

HFETs (Heterojunction Field Effect Transistors) have found use in mobile telephones and other communications systems and devices. Such devices have often been used in depletion mode, thus requiring the application of a positive bias to the drain electrode and a negative bias to the gate electrode. This, in turn, has required the presence of a positive and negative power source, resulting in an increase in the size and weight of the system or device. Consequently, it has become desirable in these applications to replace the depletion mode HFET with an enhancement mode HFET, which does not require the application of a negative bias to the gate electrode or the accompanying devices required to achieve that bias.

Figure 1:
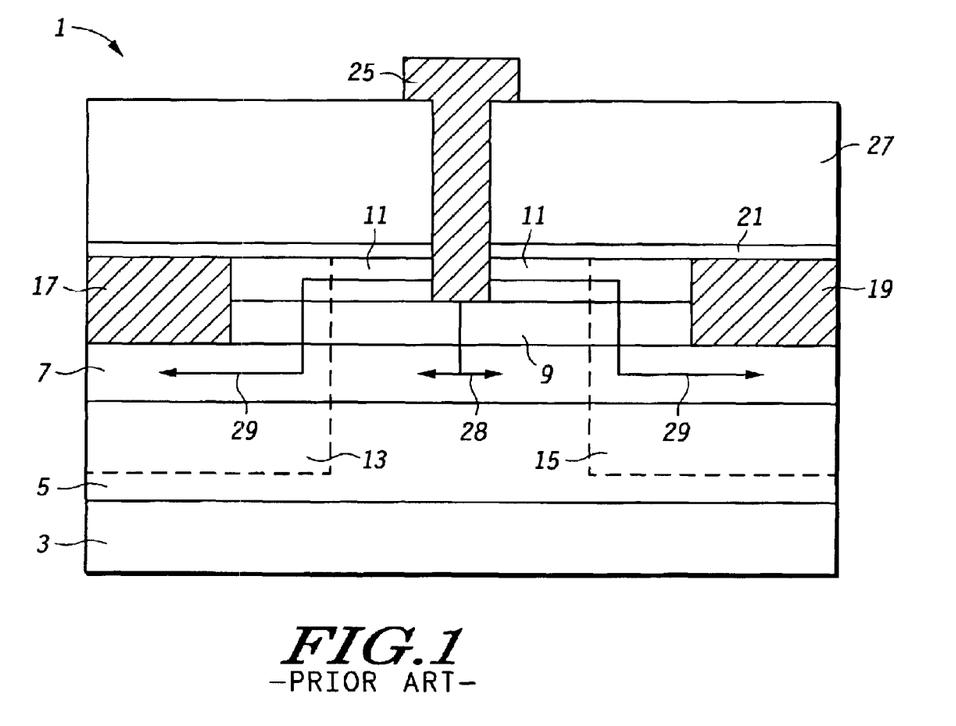
FIG. 1 is a cross-sectional illustration of a known enhancement mode RF device.

FIG. 1 shows a simplified cross-sectional view of a known enhancement mode HFET. The device 1 shown therein is formed on a wafer 3 and includes a buffer layer 5 comprising GaAs which is formed on the upper surface of the wafer. An InGaAs channel layer 7 is formed on the buffer layer, an AlGaAs barrier layer 9 (so called because the bandgap of AlGaAs is larger than the bandgap of either GaAs or InGaAs) is formed on the channel layer, and a cap layer 11 made out of a material such as gallium arsenide (GaAs) is formed on the barrier layer. Source 13 and drain 15 areas are formed by ion implantation through the cap layer and extend through the cap layer, the barrier layer, and the channel layer and partially into the buffer layer. A source contact 17 and a drain contact 19 are disposed above the channel layer. A dielectric layer 21 is disposed over the cap layer and the source and drain contacts. The resulting structure is then covered with a material such as tetraethyl orthosilicate (TEOS) 27. An opening is etched through the TEOS layer, dielectric layer and the cap layer, and metal is deposited in the opening to form a gate 25.

While enhancement mode HFETs of the type depicted in FIG. 1 have many desirable properties, these devices are frequently found to exhibit a forward turn-on voltage of the gate diode ($V_{ON}$) that is unexpectedly lower than the design value. Many of these devices are found to be prone to excessive current leakage and poor gate properties, as well as excessive contact and access resistances. There is thus a need in the art for methods for making enhancement mode HFETs that exhibit a $V_{ON}$ comparable to the design value, and that have improved gate properties and minimized contact and access resistances, but do not result in excessive current leakage. These and other needs are met by the devices and methodologies disclosed herein.

SUMMARY OF THE INVENTION

In one aspect, a method for making an enhancement mode RF device is provided herein, comprising the steps of providing a substrate having a stack of semiconductor layers formed thereon, the stack including a cap layer (which may comprise, for example, GaAs) and a central layer defining a device channel; disposing a photoresist mask over the cap layer, thereby defining a masked region and an unmasked region; and, in any order, (a) creating an implant region (which is preferably an $N^+$ implant region) in the unmasked region, and (b) removing the cap layer from the unmasked region. Preferably, after steps (a) and (b) are performed, the implant region and the capped region do not substantially overlap. Hence, the implant region is preferably formed in the stack of semiconductor layers so as to define an implant-free area in the device channel between the source and drain which essentially coincides with the cap. The stack of compound semiconductor layers may then be etched in the source and drain regions to form source contact and drain contact areas. The method may further comprise the steps of, in any sequence, forming a device insulation structure over the implant-free area and etching a gate opening through the device insulation structure and the cap layer of the stack compound semiconductor layers in the implant-free area, the gate opening being spaced from the source contact area and the drain contact area. Electrical contacts may then be deposited in the central layer in the source contact area and the drain contact area, and a gate metal may then be deposited in the opening to form a gate contact.

In another aspect, a method for making an enhancement mode RF device is provided herein, comprising the steps of providing a substrate having a stack of semiconductor layers formed thereon, the stack including a cap layer (which may comprise, for example, GaAs) and a central layer defining a device channel; disposing a dielectric mask over the cap layer, thereby defining a masked region and an unmasked region; and, in any order, (a) creating an implant region (which is preferably an $N^+$ implant region) in the unmasked region, and (b) removing the cap layer from the unmasked region. Preferably, after steps (a) and (b) are performed, the implant region and the capped region do not substantially overlap. Hence, the implant region is preferably formed in the stack of semiconductor layers so as to define an implant-free area in the device channel between the source and drain which essentially coincides with the cap. The stack of compound semiconductor layers may then be etched in the source and drain regions to form source contact and drain contact areas. The method may further comprise the steps of, in any sequence, forming a device insulation structure over the implant-free area and etching a gate opening through the device insulation structure and the cap layer of the stack compound semiconductor layers in the implant-free area, the gate opening being spaced from the source contact area and the drain contact area. Electrical contacts may then be deposited in the central layer in the source contact area and the drain contact area, and a gate metal may then be deposited in the opening to form a gate contact.

These and other aspects of the present invention are described in further detail below.

DETAILED DESCRIPTION

Figure 2:
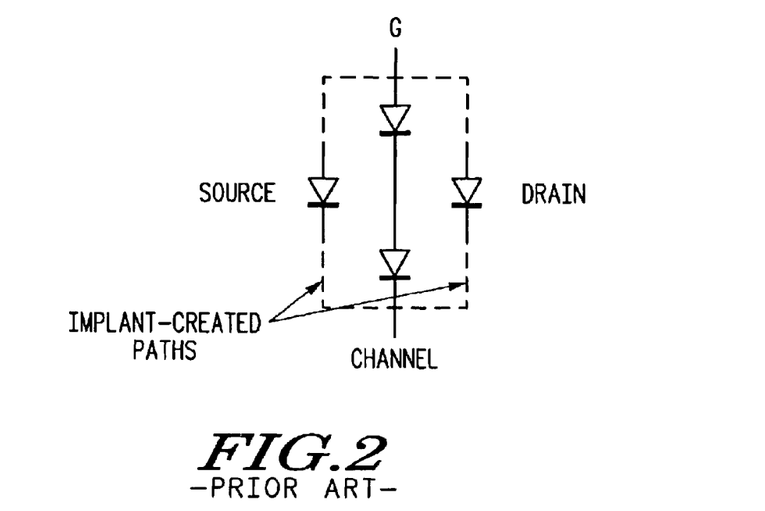
FIG. 2 is a diagram depicting the implant-created paths in the device of FIG. 1.

Surprisingly, it has now been found that the aforementioned problems frequently encountered in enhancement mode HFETs can arise from the overlap of the cap layer with the implant regions in these devices. As indicated by arrows 29 in FIG. 1, the implantation process used to form the source and drain regions results in the formation of alternative leakage paths between the gate and channel, in addition to the main leakage path indicated by arrow 28. Hence, as indicated schematically in the illustration of FIG. 2, the cumulative result of these additional paths is to lower the $V_{ON}$ of the device, resulting in excessive current leakage.

Figure 3:
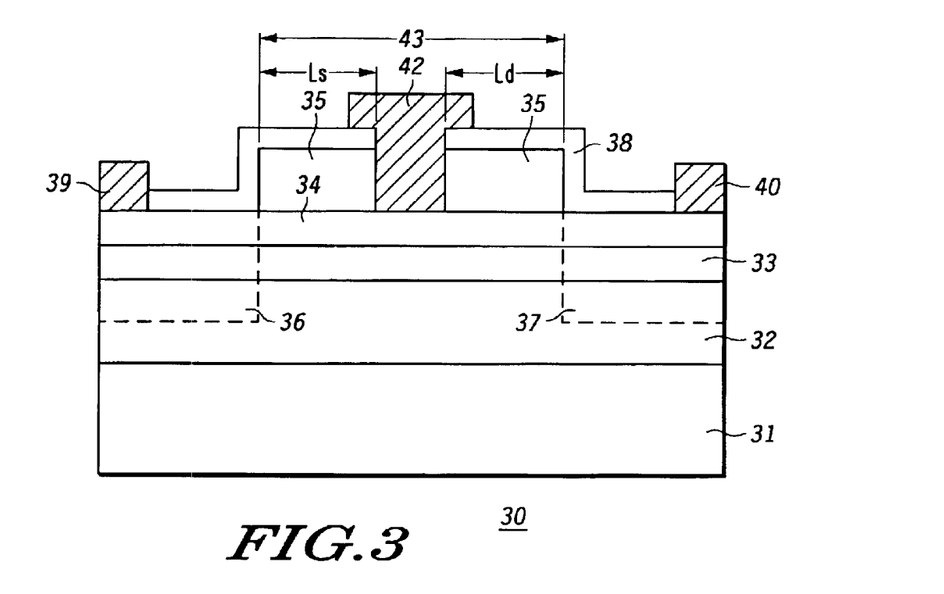
FIG. 3 is a cross-sectional illustration of an enhancement mode RF device made in accordance with the teachings herein.

FIG. 3 shows a simplified cross-sectional view of one particular example of an enhancement mode HFET that can be made in accordance with the teachings herein and that does not suffer from the infirmities of the device of FIG. 1. The device 30 of FIG. 3 is formed on a wafer 31 and includes a buffer layer 32 formed on the upper surface of the wafer. An indium gallium arsenide (InGaAs) channel layer 33 is disposed on the buffer layer, an aluminum gallium arsenide (AlGaAs) barrier layer 34 is disposed on the InGaAs channel layer, and a gallium arsenide (GaAs) cap layer 35 is disposed on the AlGaAs layer. The source and drain implant areas 36 and 37, which are spaced from the gate area a distance $L_s$ and $L_d$, respectively, are defined such that the GaAs cap layer does not extend over them. The distance $L_d$ has an effect on drain breakdown voltage such that breakdown voltage increases with $L_d$. The distance $L_s$ has an effect on gate to source breakdown voltage in that, if $L_s$ is too long, current decreases. Hence, appropriate values for $L_d$ and $L_s$ will be determined, in part, by the desired characteristics of the HFET.

A silicon oxynitride (SiON) layer 38 is disposed over the GaAs cap layer and the exposed surfaces of the underlying AlGaAs layer. A source ohmic contact 39 and a drain ohmic contact 40 are disposed over the source and drain regions, respectively. A metal gate 42 extends through an opening in the GaAs cap layer and contacts the underlying AlGaAs layer.

A. Methods of Achieving Alignment between Cap Layer and Implant Regions

A device of the type depicted in FIG. 3, in which the end of each implant region is aligned with the end of the cap layer so that there is little or no overlap between the two, may be realized in a number of ways.

One possible approach for achieving proper alignment between the GaAs cap layer and the implant regions is to utilize a single photoresist pattern directly on the GaAs cap surface for purposes of both N⁺ implant and GaAs cap removal. This type of approach is referred to herein as a "resist only" approach.

A second possible approach for achieving proper alignment between the GaAs cap layer and the implant regions is to deposit a dielectric on the GaAs cap surface and, using a photoresist, pattern a hardmask in the dielectric. The photoresist may then be stripped, and the dielectric may be used to selectively block implantation into the semiconductor and act as a GaAs recess mask. This type of approach is referred to herein as a "hardmask only" approach.

A third possible approach for achieving proper alignment between the GaAs cap layer and the implant regions is to deposit a dielectric on the GaAs cap layer surface that can be used as an implant cap and/or as a wet etch hard mask. A single photoresist pattern may be used on top of the dielectric layer as an implant mask and to define a hard mask for wet etching the GaAs cap layer. This type of approach is referred to herein as a "resist plus hardmask" approach.

Each of these approaches is described in greater detail below.

B. "Resist Only" Approach

The "resist only" approach involves the use of a photoresist mask to define both the source and drain implant regions and the recess (the recess refers to the selective removal of the cap layer over the implant regions). After these steps are accomplished, the photoresist mask may be conveniently stripped to allow further processing of the device such as, for example, the definition of a gate structure.

There are at least two process sequences which may be used in a "resist only" approach. These sequences, which are illustrated in the flowcharts of FIGS. 4–5, differ primarily in the order in which the implant and recess steps are accomplished.

Figure 4:
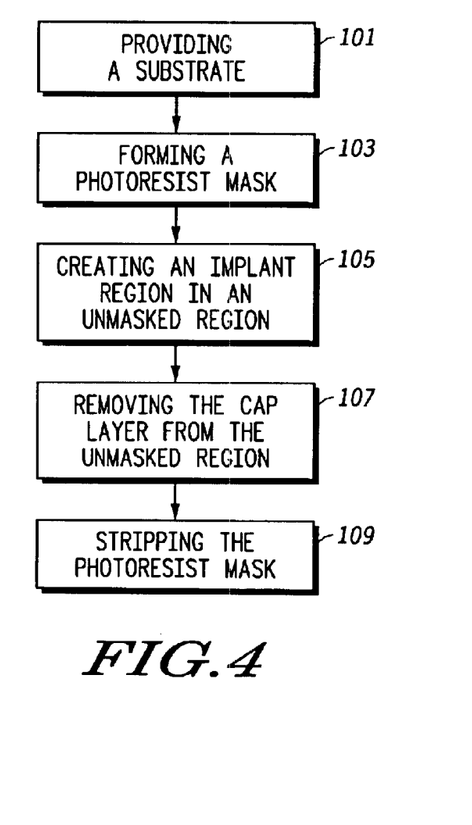
FIGS. 4–5 are flow charts depicting a methodology for making an enhancement mode RF device in accordance with the teachings herein.

In the first sequence, depicted in FIG. 4, a substrate is provided 101 having a stack of semiconductor layers formed thereon. The stack includes a cap layer, and also includes a central layer which defines the channel for the device. Next, a photoresist mask is formed 103 over the cap layer. The photoresist mask defines a masked region and an unmasked region. An implant region is then created 105 within the unmasked region, and the cap layer is removed 107 from the unmasked region. The photoresist mask is then stripped 109, and the device is subjected to such further processing as may be necessary to define the gate and the other elements of the device.

Figure 5:
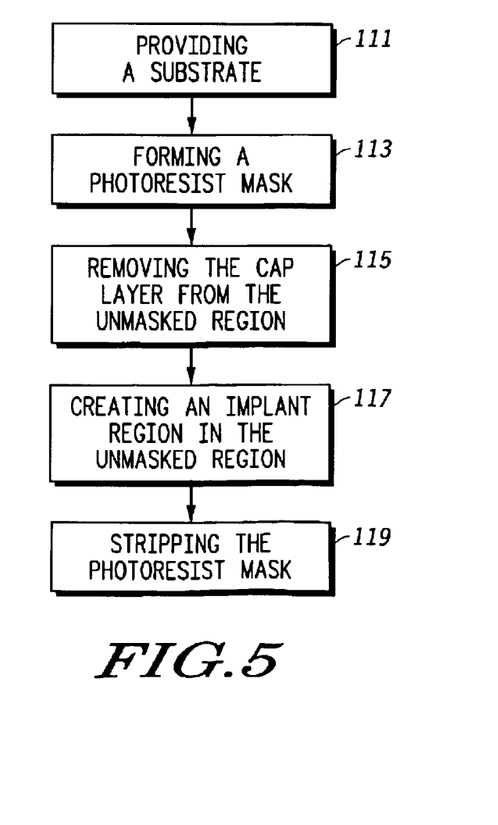

In the second sequence, depicted in FIG. 5, a substrate is provided 111 having a stack of semiconductor layers formed thereon. The stack includes a cap layer, and also includes a central layer which defines the channel for the device. Next, a photoresist mask is formed 113 over the cap layer. The photoresist mask defines a masked region and an unmasked region. The cap layer is removed 115 from the unmasked region, and an implant region is then created 117 within the unmasked region. The photoresist mask is then stripped 119, and the device is subjected to such further processing as may be necessary to define the gate and the other elements of the device.

Figure 6:
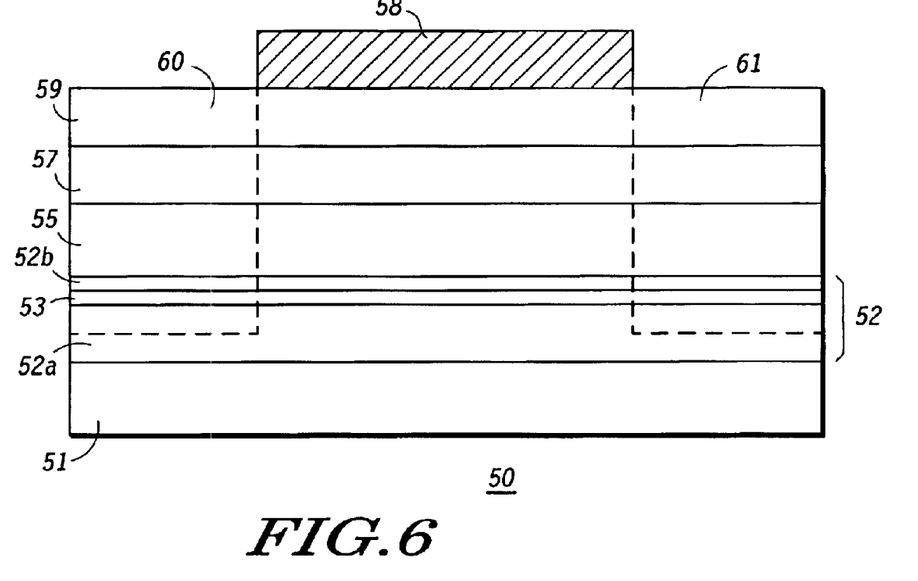
FIGS. 6–7 are cross-sectional illustrations of intermediate structures which demonstrate a process for making enhancement mode RF devices in accordance with the teachings herein.
Figure 7:
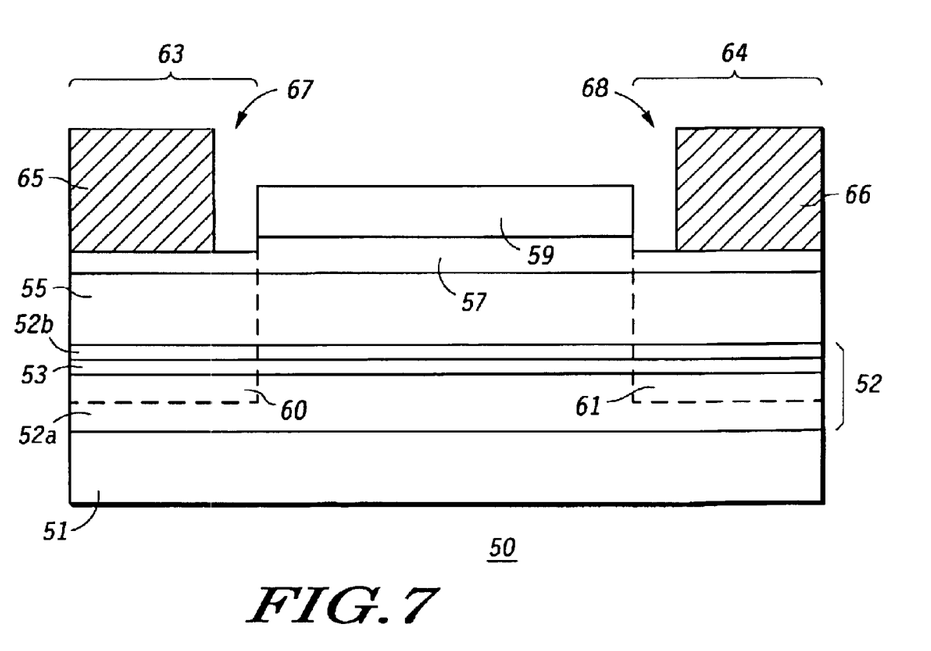

The "resist only" approach may be further understood with reference to FIGS. 6–7, which illustrate a specific embodiment of this methodology. Of course, one skilled in the art will appreciate that, in its broadest sense, this embodiment is not particularly limited to the specific structures, features or materials described in FIGS. 6–7.

FIG. 6 is a simplified cross-sectional view of an initial step in the fabrication process of an enhancement mode RF device 50 in accordance with the present invention. The device depicted in FIG. 6 includes a substrate 51 having a stack of compound semiconductor layers formed thereon. In the specific embodiment shown in the figure, the substrate is formed of gallium arsenide (GaAs) and the buffer 52, including a GaAs layer 52a, a thin layer 53 of doped silicon, and a GaAs layer 52b, is epitaxially grown on the upper surface thereof. The central layer 55 of indium gallium arsenide (InGaAs), which generally defines the device channel, is epitaxially grown on the buffer. Layer 55 is referred to herein as the "central" layer because different embodiments or different applications might include different numbers or types of layers of compound semiconductor materials in the stack. The central layer may be specifically fabricated to produce some crystallographic strain in the central layer and preferably includes high InGaAs content to improve carrier mobility in the device channel and, thereby, reduce the ON resistance. An AlGaAs barrier layer 57, preferably including 75% AlAs and 25% GaAs, is epitaxially grown on the InGaAs central layer and a doped GaAs cap layer 59 is epitaxially grown on the AlGaAs layer. Of course, one skilled in the art will appreciate that other similar wide band gap materials may be used in place of the AlGaAs, such as InGaP, GaN, or the like. Also, as will be explained in more detail below, specific combinations of doping and thickness of the GaAs cap layer can be used to control both the gate-to-drain break down voltage ($BV_{GDO}$) and the channel sheet resistance ($R_{SH}$) adjacent to the gate.

With the substrate and the stack of compound semiconductor layers formed as described, the GaAs cap layer is masked with a photoresist mask 58, and source and drain implants 60 and 61 (illustrated by broken lines) are introduced into the stack of compound semiconductor layers and buffer using the photoresist as an implant mask. Here it should be specifically noted that the implants extend at least through the InGaAs central layer 55, and preferably extend to the GaAs layer 52a of buffer 52. The implants are spaced apart to define implant-free (and doping-free) areas in the InGaAs central layer 55 and AlGaAs layer 57, as well as in buffer layer 52. In the specific embodiment, GaAs cap layer 59 is doped for n-type conductivity and the implants are heavily doped ($N^+$).

The stack of compound semiconductor layers is then etched using the photoresist mask 58 as an etch mask, as illustrated in FIG. 7, and employing standard lithographic techniques, to remove a portion of the GaAs cap layer 59 and some of the AlGaAs layer 57. The source contact area 63 and drain contact area 64 are formed as a result of the etch.

In some applications it may be acceptable to only etch through the GaAs cap layer to the surface of the AlGaAs semiconductor insulating layer 57 to form the source and drain contact area, while in other applications a portion of the AlGaAs layer may be removed as well. However, it is preferred that at least a portion of the AlGaAs layer is retained, since this is found to give rise to better contact resistance than if the entire AlGaAs layer is removed. Metal is deposited in the source contact area 63 and drain contact area 64 to form ohmic electrical contacts 65 and 66 to the InGaAs central layer 55. It should be noted that in this embodiment the etched contact areas 63 and 64 are slightly larger than ohmic electrical contact 65 and 66 so as to define a trench or insulation space, designated 67 and 68, between doped cap layer 59 and each ohmic electrical contact 65 and 66.

Figure 8:
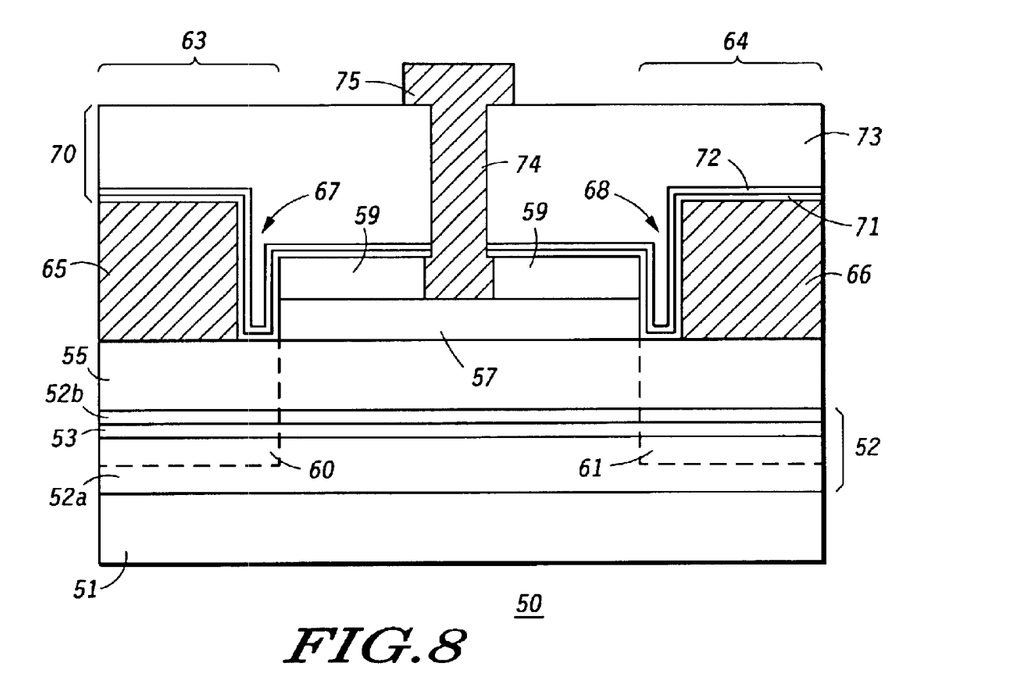
FIG. 8 is a cross-sectional illustration of an enhancement mode RF device made in accordance with the teachings herein.

Turning to FIG. 8, a device insulation structure, generally designated 70, is formed by deposition over ohmic electrical contacts 65 and 66, within insulation spaces 67 and 68 in the source contact area 63 and the drain contact area 64. The insulation structure also extends over the cap layer 59 which overlies the implant free area. In this particular embodiment, insulation structure 70 includes a first thin layer of silicon nitride ($Si_3N_4$) 71, a second thin layer of aluminum nitride (AlN) 72, and relatively thick insulating layer of TEOS 73. It should be noted that FIG. 7 is not drawn to scale but is illustrated to provide the best understanding. As a non-limiting example of sizes in one specific embodiment of the structure depicted in FIG. 8, InGaAs central layer 55 is approximately 150 angstroms thick, AlGaAs layer 57 is approximately 250 angstroms thick, doped GaAs cap layer 59 is approximately 400 angstroms thick, $Si_3N_4$ layer 71 is approximately 200 angstroms thick, AlN layer 72 is approximately 200 angstroms thick, and TEOS layer 73 is approximately 3000 angstroms thick. Also, while metal contacts 65 and 66 will likely be much thicker than AlGaAs layer 57 and GaAs cap layer 59, they are shown slightly larger for convenience and understanding the structure.

The gate opening 74 is then defined using a standard photoresist (not shown) and a combination of wet and dry etch processes is used to etch the opening through insulation structure 70 to the upper surface of layer 57. Specific details as to preferred etching processes for the layers and insulation structure 70 can be found in U.S. Pat. No. 5,484,740, entitled "Method of Manufacturing a III-V Semiconductor Gate Structure", issued Jan. 16, 1996, and in U.S. Pat. No. 5,619,064, entitled "III-V Semiconductor Gate Structure and Method of Manufacture", issued Apr. 8, 1997. During this etching process, AlN layer 72 can be used as an etch stop layer within gate opening 74.

It should be noted that TEOS layer 73 is anisotropically etched to initially define gate opening 74, after which the photoresist can be removed and TEOS layer 73 used as an etch mask. Also, aluminum nitride layer 72 operates as an etch stop for the etching of TEOS layer 73. AlN layer 72 is then etched in a wet chemical etch with $Si_3N_4$ layer 71 providing protection against undo damage to cap layer 59. Again, it should be briefly noted that the etching of AlN layer 72 is nearly vertical or anisotropic to provide a very well-defined gate opening 74. $Si_3N_4$ layer 71 is then etched using a gentle reactive ion etch to expose the surface of GaAs cap layer 59. Etching $Si_3N_4$ layer 71 produces a slight undercut of aluminum nitride layer 72 which does not cause a problem in defining or filling gate opening 74. Using insulation structure 70 as an etch mask, at least some of the compound semiconductor stack (in this embodiment, cap layer 59) is removed to expose the upper surface of AlGaAs layer 57.

Gate opening 74 is spaced from source contact area 63 and drain contact area 64 by distances which are derived in a well-known manner to provide desired characteristics (e.g., break-down and operating voltages, etc.) for the device. This again is a relatively simple masking etch procedure. Etched gate opening 74 is then filled with gate contact metal (e.g. by sputtering or the like) to form a gate contact 75.

Since AlGaAs layer 57 includes 75% AlAs, an improved barrier is formed between gate contact 75 and the device channel, i.e., InGaAs central layer 55. Here it should be noted that the thickness of AlGaAs layer 57 can be changed (e.g., reduced) and the amount of doping of silicon δ-doping layer 53 can be adjusted to modify the transconductance (Gm) and threshold of device 50. Further, because GaAs cap layer 59 is easily modified in both thickness and doping, specific combinations of doping and thickness can be derived to control both the gate to drain break down voltage ($BV_{GDO}$) and the channel sheet resistance ($R_{SH}$) adjacent to the gate. These potential design changes offer more design freedom to the novel fabrication method disclosed herein. Moreover, by providing a strained InGaAs channel layer 55 and an undoped channel, carrier mobility in the channel is substantially improved and series resistance is also improved. Because of the doped cap layer and the undoped channel layer, depletion mode behavior in the contact access regions is created and the leakage current is low enough to provide true enhancement mode operation of device 50.

C. "Hard Mask Only" Approach

The "hard mask only" approach involves the use of a hard mask to define both the source and drain implant regions and the recess (the recess refers to the selective removal of the cap layer over the implant regions). The hard mask itself may be conveniently patterned (for the purposes of cap removal and implantation) through the use of a photoresist, after which the photoresist may be removed if desired before further processing. After cap removal or implantation, the hard mask may be conveniently stripped to allow further processing of the device such as, for example, the definition of a gate structure. This approach may be used to realize a structure similar to that depicted in FIG. 8.

There are at least two process sequences which may be used in a "hard mask only" approach. These sequences, which are generally illustrated in the flowcharts of FIGS. 9–10, differ primarily in the order in which the implant and recess steps are accomplished.

Figure 9:
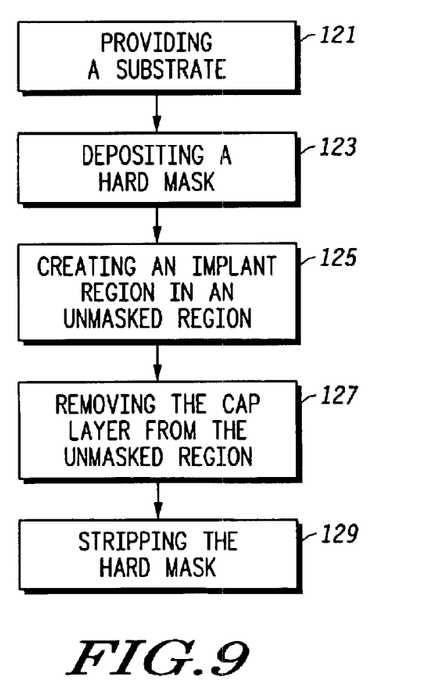
FIGS. 9–12 are flow charts depicting a methodology for making an enhancement mode RF device in accordance with the teachings herein.

In the first sequence, depicted in FIG. 9, a substrate is provided 121 having a stack of semiconductor layers formed thereon. The stack includes a cap layer, and also includes a central layer which defines the channel for the device. Next, a hard mask is formed 123 over the cap layer. This step may involve, for example, deposition of the hard mask material, patterning of the hard mask material through the use of a photoresist, and subsequent removal of the photoresist. The hard mask defines a masked region and an unmasked region. An implant region is then created 125 within the unmasked region, and the cap layer is removed 127 from the unmasked region. The hard mask is then stripped 129, and the device is subjected to such further processing as may be necessary to define the gate and the other elements of the device.

Figure 10:
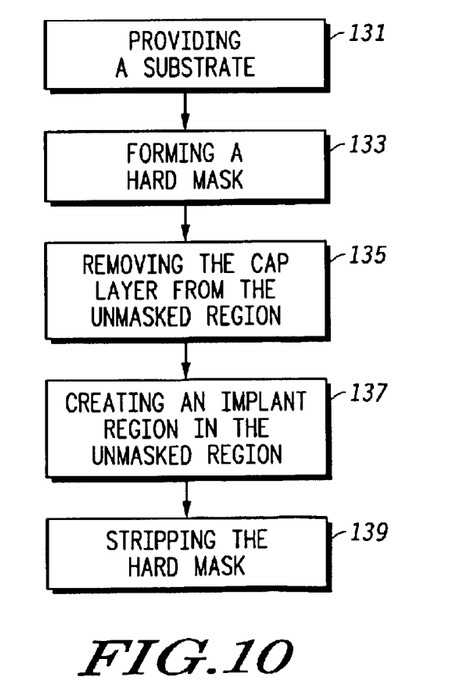

In the second sequence, depicted in FIG. 10, a substrate is provided 131 having a stack of semiconductor layers formed thereon. The stack includes a cap layer, and also includes a central layer which defines the channel for the device. Next, a hard mask is formed 133 over the cap layer (as noted above, the hard mask may be patterned through the use of a photoresist). The hard mask defines a masked region and an unmasked region. The cap layer is removed 135 from the unmasked region, and an implant region is then created 137 within the unmasked region. The hard mask is then stripped 139, and the device is subjected to such further processing as may be necessary to define the gate and the other elements of the device.

D. "Resist Plus Hard Mask" Approach

The "resist plus hard mask" approach involves the use of both photoresist and a hard mask to define the source and drain implant regions and the recess (the recess refers to the selective removal of the cap layer over the implant regions). In a typical embodiment of this approach, a dielectric may be deposited on the cap layer surface that can be used as an implant cap and/or as a wet etch hard mask. A single photoresist pattern may then be used on top of the dielectric layer as an implant mask and to define a hard mask for etching the GaAs cap layer. After these steps are accomplished, the photoresist mask and hard mask may be conveniently stripped to allow further processing of the device such as, for example, the definition of a gate structure. This approach may be used to realize a structure similar to that depicted in FIG. 8.

There are at least five possible process sequences which may be used in the "resist plus hard mask" approach. These sequences, two which are specifically illustrated in the flowcharts of FIGS. 11–12, differ primarily in the order in which the hard mask etch, implant, resist strip, and recess steps are accomplished.

Figure 11:
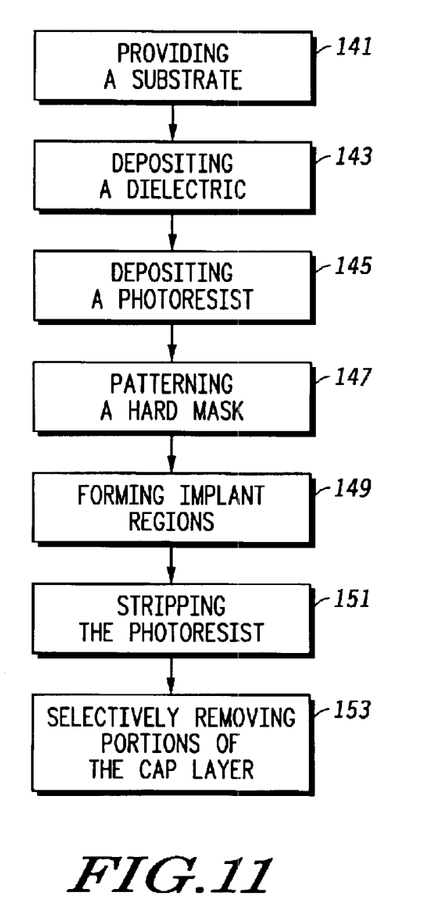

In the first sequence, depicted in FIG. 11, a substrate is provided 141 having a stack of semiconductor layers formed thereon. The stack includes a cap layer, and also includes a central layer which defines the channel for the device. A dielectric material is then deposited 143 over the cap layer, followed by the deposition 145 of a photoresist. The dielectric material is then etched 147 using photoresist as an etch mask in a pattern to form a hard mask, and the implant regions are formed 149 by using the same photoresist as an implant mask. The photoresist is then stripped 151, and the portions of the cap layer extending over the implant regions are selectively removed 153 using the dielectric hard mask as an etch mask.

The second sequence is the same as the first sequence, except that the order of the photoresist strip and cap removal steps are reversed. That is, step 153 occurs before step 151.

The third sequence is the same as the first sequence, except that the order of the implantation and hard mask steps are reversed. That is, step 149 occurs before step 147.

Figure 12:
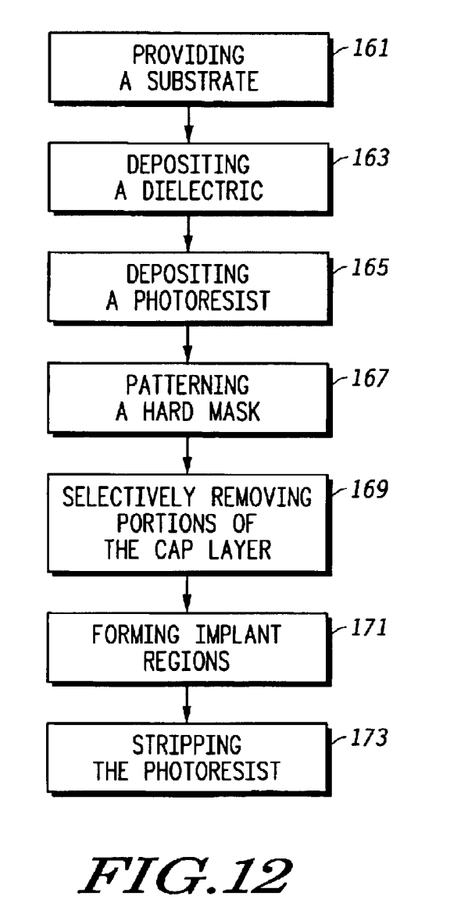

In the fourth sequence, depicted in FIG. 12, a substrate is provided 161 having a stack of semiconductor layers formed thereon. The stack includes a cap layer, and also includes a central layer which defines the channel for the device. A dielectric material is then deposited 163 over the cap layer, followed by the deposition 165 of a photoresist. The dielectric material is then etched 167 in a pattern to form a hard mask, thus defining a masked region and an unmasked region. Portions of the cap layer are then selectively removed 169 from the unmasked region by, for example, using the hard mask in a wet etch process, after which implant regions are formed 171 by using the photoresist as an implant mask. The photoresist is then stripped 173.

The fifth sequence is the same as the fourth sequence, except that the order of the implantation and the photo resist strip steps are reversed. That is, step 173 occurs before step 171.

E. Conclusion

Novel methods have been provided herein for making an enhancement mode RF device. These methods employ various combinations of processing steps involving photoresist masks and/or hard masks to define the cap layer and the implant regions in the source and drain areas of the device in such a way that the implant regions and the capped regions do not overlap. As a result, the formation of alternate conductive paths between the source and drain in these devices is reduced or eliminated, allowing these devices to exhibit forward turn-on voltages of the gate diode ($V_{ON}$) that are more consistently comparable to the design value. The structures achievable with these methodologies also exhibit lower contact and access resistances, are less prone to excessive current leaks, and exhibit superior gate properties.

While specific embodiments of the methodologies and devices described herein have been illustrated and explained in detail, further modifications and improvements in these methodologies and devices are possible without departing from the scope of invention. It is to be understood, therefore, that the scope of invention, as defined by the appended claims or by such claims as may be presented or could be presented based on the present disclosure, is not limited to the particular embodiments described herein. Thus, such claims should be construed to cover all modifications that do not depart from the scope of invention.

What is claimed is:

1. A method for making an enhancement mode RF device, comprising the steps of:

providing a substrate having a stack of semiconductor layers formed thereon, the stack including a doped cap layer and a central layer defining a device channel;

disposing a mask over the cap layer, thereby defining a masked region and an unmasked region; and in any order, (a) creating an implant region in the unmasked region, and (b) removing the cap layer from the unmasked region.

2. The method of claim 1, wherein the mask is a dielectric mask.

3. The method of claim 1, wherein the mask is a photoresist mask.

4. The method of claim 1, wherein, after steps (a) and (b) are performed, the implant region and the cap layer region do not substantially overlap.

5. The method of claim 1, wherein the implant region is created before the cap layer is removed from the unmasked region.

6. The method of claim 1, wherein the implant region is created after the cap layer is removed from the unmasked region.

7. The method of claim 1, wherein the stack of semiconductor layers further comprises a source and a drain, wherein the implant region is formed in the stack of semiconductor layers so as to define an implant-free area in the device channel between the source and drain, and wherein the implant-free area is essentially self-aligned with the cap layer.

8. The method of claim 7, further comprising the steps of:
etching the stack of compound semiconductor layers at the source and drain to form source contact and drain contact areas; and in any sequence, forming a device insulation structure over the implant-free area and etching a gate opening through the device insulation structure and the cap layer of the stack compound semiconductor layers over the implant-free area.

9. The method of claim 8, further comprising the step of depositing gate metal in the gate opening to form a gate contact.

10. The method of claim 8, wherein the stack of compound semiconductor layers includes an electrically insulating layer disposed between the cap layer and the central layer, wherein the stack is etched through the cap layer and partially through the electrically insulating layer, and wherein the method further comprises the step of depositing electrical contacts on the exposed portion of the insulating layer in the source contact area and the drain contact area.

11. The method of claim 1, wherein the implant region is an N+ implant region.

12. The method of claim 1, wherein the cap layer comprises GaAs.

13. The method of claim 12, wherein the photoresist mask is removed before steps (a) and (b) are performed.

14. A method for making an enhancement mode RF device, comprising the steps of:
providing a substrate having a stack of semiconductor layers formed thereon, the stack including a doped cap layer and a central layer defining a device channel;

depositing a dielectric layer over the cap layer;

depositing a photoresist over the dielectric layer; and in any order, (a) forming a dielectric mask out of the dielectric layer, (b) creating an implant region, (c) selectively removing a portion of the cap layer, thereby defining a capped region and an uncapped region, and (d) removing the photoresist;

wherein, after steps (b) and (c) are performed, the implant region and the capped region do not substantially overlap.

15. A method for making an enhancement mode RF device, comprising the steps of:

providing a semiconductor construct having a first layer comprising GaAs disposed over a second layer comprising AlGaAs;

disposing a dielectric layer on the first layer;

forming a photoresist mask over the dielectric layer, thereby defining a first masked region and a first unmasked region, the first unmasked region including a first portion of the first layer;

patterning a hardmask in the dielectric layer, thereby defining a second masked region and a second unmasked region, the second unmasked region including a second portion of the first layer;

removing the photoresist;

creating an N+ implant in the second unmasked region; and removing the first and second portions of the first layer.

16. A method for making an enhancement mode RF device, comprising the steps of:

providing a substrate having a stack of compound semiconductor layers formed thereon, the stack including (a) a doped cap layer, and (b) a central layer defining a device channel; and implanting a source and drain in the stack of semiconductor layers so as to define an implant-free area in the device channel between the source and drain which substantially coincides with the cap layer.

17. The method of claim 16, wherein the stack further comprises a buffer, and wherein the source and drain extend at least into the buffer.

18. The method of claim 17, further comprising the steps of, in any sequence, forming a device insulation structure over the implant-free area, and etching a gate opening through the device insulation structure and the cap layer of the stack compound semiconductor layers in the implant-free area, the gate opening being spaced from the source and the drain.

19. A method for making an enhancement mode RF device, comprising the steps of:

providing a substrate having a stack of semiconductor layers formed thereon, the stack including doped a cap layer and a central layer defining a device channel;

disposing a first mask over the cap layer, thereby defining a first masked region and a first unmasked region;

in any order, (a) creating an implant region in the first unmasked region, and (b) removing the cap layer from the first unmasked region;

removing the first mask;

disposing a second mask, distinct from said first mask, over the cap layer, thereby defining a second masked region and a second unmasked region; and forming a gate opening through the cap layer in the second unmasked region.

20. The method of claim 9, wherein the implant region comprises a source and a drain, and wherein the gate is disposed between the source and drain.

21. The method of claim 1, wherein the cap layer and the implant region are not in physical contact.

22. The method of claim 14, wherein the cap layer and the implant region are not in physical contact.

23. The method of claim 16, wherein the cap layer is not in physical contact with either the source or the drain.

* * * * *